United States Patent
Tang et al.

(10) Patent No.: US 7,486,520 B2
(45) Date of Patent: Feb. 3, 2009

(54) MODULAR FLASH MEMORY CARD EXPANSION SYSTEM

(75) Inventors: Choon-Tak Tang, Irvine, CA (US); Kam Cheong Chin, Irvine, CA (US)

(73) Assignee: Kingston Technology Corporation, Inc., Fountain Valley, CA (US)

( * ) Notice: Subject to any disclaimer, the term of this patent is extended or adjusted under 35 U.S.C. 154(b) by 55 days.

(21) Appl. No.: 11/754,224

(22) Filed: May 25, 2007

(65) Prior Publication Data

US 2008/0291713 A1 Nov. 27, 2008

(51) Int. Cl.
H05K 7/00 (2006.01)

(52) U.S. Cl. ........................... 361/729; 439/701

(58) Field of Classification Search ................. 361/729, 361/735, 737, 790; 439/701, 708, 711, 712, 439/715, 61
See application file for complete search history.

(56) References Cited

U.S. PATENT DOCUMENTS

| | | | | |
|---|---|---|---|---|
| 3,812,402 A | * | 5/1974 | Garth | 361/687 |
| 4,857,005 A | * | 8/1989 | Kikuchi et al. | 439/140 |
| 6,036,551 A | | 3/2000 | Szczesny | |
| 6,097,605 A | * | 8/2000 | Klatt et al. | 361/737 |
| 6,498,731 B1 | * | 12/2002 | Roscoe et al. | 361/796 |
| 6,540,523 B1 | * | 4/2003 | Kung et al. | 439/64 |
| 6,663,007 B1 | * | 12/2003 | Sun et al. | 235/487 |
| 7,298,625 B1 | * | 11/2007 | Wu et al. | 361/735 |
| D562,817 S | * | 2/2008 | Fiorentino | D14/356 |
| 7,344,416 B2 | * | 3/2008 | Quijin | 439/630 |
| 2005/0014395 A1 | * | 1/2005 | Fjelstad et al. | 439/61 |

* cited by examiner

Primary Examiner—Hae Moon Hyeon
(74) Attorney, Agent, or Firm—Sawyer Law Group LLP

(57) ABSTRACT

A memory card system is disclosed. The memory card system comprises at least one flash memory card and a module for holding the at least one memory card. The module comprises a plurality of supports. The supports include rails to guide the at least one memory card in place and a latch system for securing the at least one memory card to the module. The present invention provides a modular flash memory card expansion system using any standard Secure Digital card; the flash memory card can be any flash-based memory card, such as SD, Compact Flash (CF), MMC, Memory Stick or others.

8 Claims, 11 Drawing Sheets

MODULAR FLASH MEMORY CARD EXPANSION SYSTEM

FIELD OF THE INVENTION

The present invention relates generally to memory systems and more specifically to a flash memory card expansion system.

BACKGROUND OF THE INVENTION

Flash memories are widely used memory devices in flash based storage, portable storage devices, or multimedia storage systems. Larger capacities and density are increasingly required. Typically in a conventional storage system the flash memory (typically in the form of a thin small outline package) is soldered onto the printed circuit board (PCB). This method not only poses a design challenge, but also lacks expandability and manufacturability.

Prior art, U.S. Pat. No. 6,036,551, introduces a stackable connector which allows for stacking several memory card connectors. The connector has a housing which consists of a base, side walls, beams, and a slot to receive the memory card. The terminals are supported by the base of the housing. There are also ledges which align the connector to a connector above and/or below it.

While this prior art addresses the stackable connector with reduced thickness, it did not address the potential terminals being damaged or bent by the memory card that is inserted between the top and bottom row of terminals (due to the way the terminals structure).

The prior art has the slot to receive the memory card, but it also did not address the way to lock the memory card in place.

Accordingly, what is desired is a system and method that addresses the above-identified issues. The present invention addresses such a need.

SUMMARY OF THE INVENTION

A memory card system is disclosed. The memory card system comprises at least one flash memory card and a module for holding the at least one memory card. The module comprises a plurality of supports. The supports include rails to guide the at least one memory card in place and a latch system for securing the at least one memory card to the module. The present invention provides a modular flash memory card expansion system using any standard Secure Digital (SD) card; the flash memory card can be any flash-based memory card, such as SD, Compact Flash (CF), (Multi-Media Card) MMC, Memory Stick or others.

DETAILED DESCRIPTION

The present invention relates generally to memory systems and more specifically a flash memory card expansion system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The modular flash memory card expansion system as shown in FIG. 1, comprises a circuit board 10. This circuit board 10 can be a printed circuit board, substrate, or others. A guided rail 5 to guide the flash memory card 11. The flash memory card can be a Secure Digital card, or any flash-based memory card, such as SD, compact flash (CF), MMC, Memory Stick or others. A space-saving module with multiple-level of pins 22. This module is designed to hold several flash memory cards in a small space. The pins are attached directly to a printed circuit board, or substrate, and held stably by an over molding process. This can be expanded to create as many levels of pins as desired, thus holding as many flash memory cards as desired. The flash memory cards are held securely in place with the latch system. This design allows for many flash memory cards to be easily attached for memory capacity expansion in terms of ease of manufacturing, faster time to market, and provide a very cost effective solution.

A system and method in accordance with the present invention facilitates modular flash memory card expansion, such as Secure Digital (SD), Compact Flash (CF), MMC, Memory Stick, or others. The backbone of the system is a space saving module that allows and holds as many flash memory cards as desired. To describe the features of the present invention in more detail, refer now to the following in conjunction with the accompanying figures.

Figure 1A:
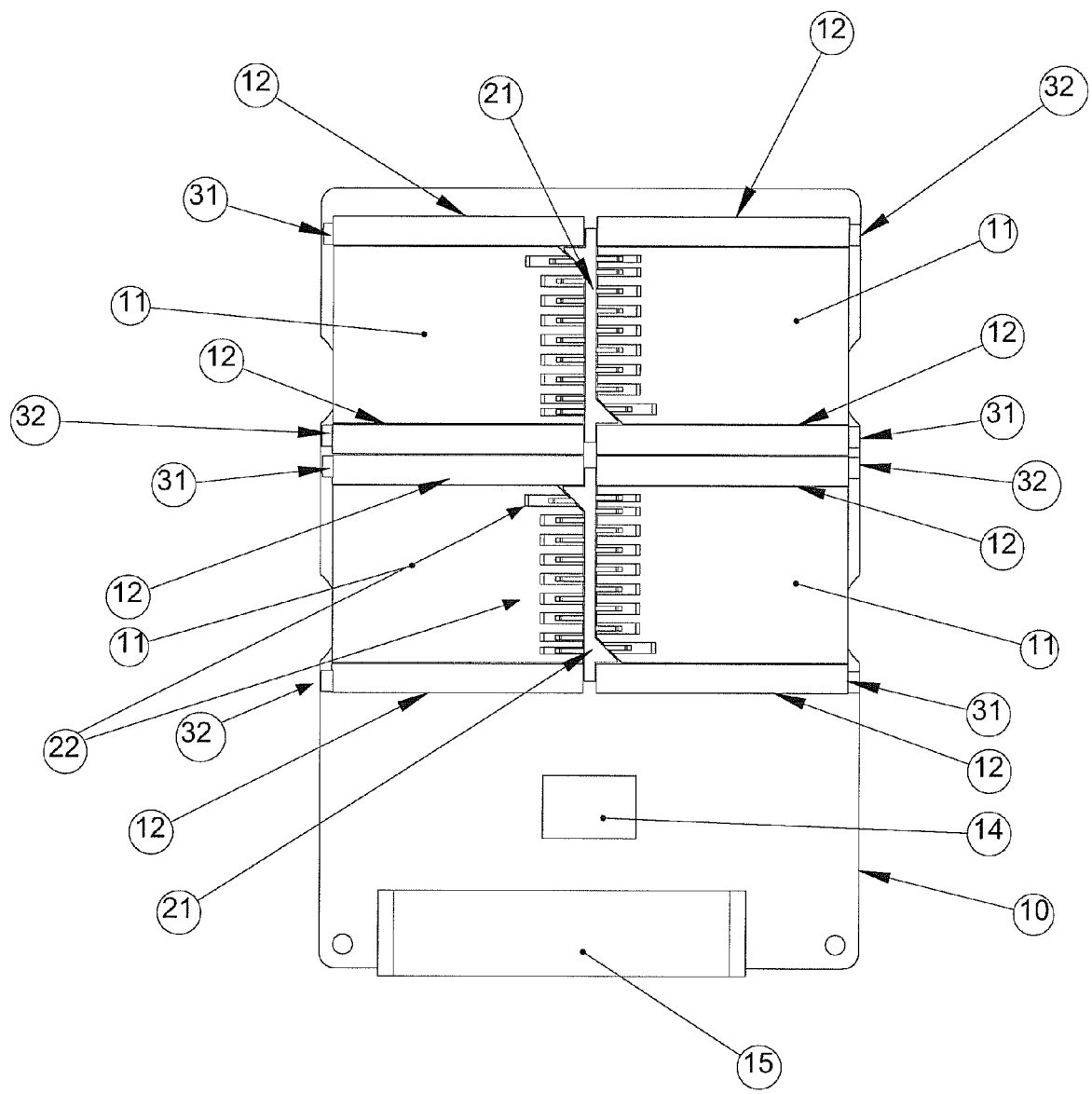
FIG. 1A shows a top view of a device using the modular flash memory card expansion system.
Figure 1B:
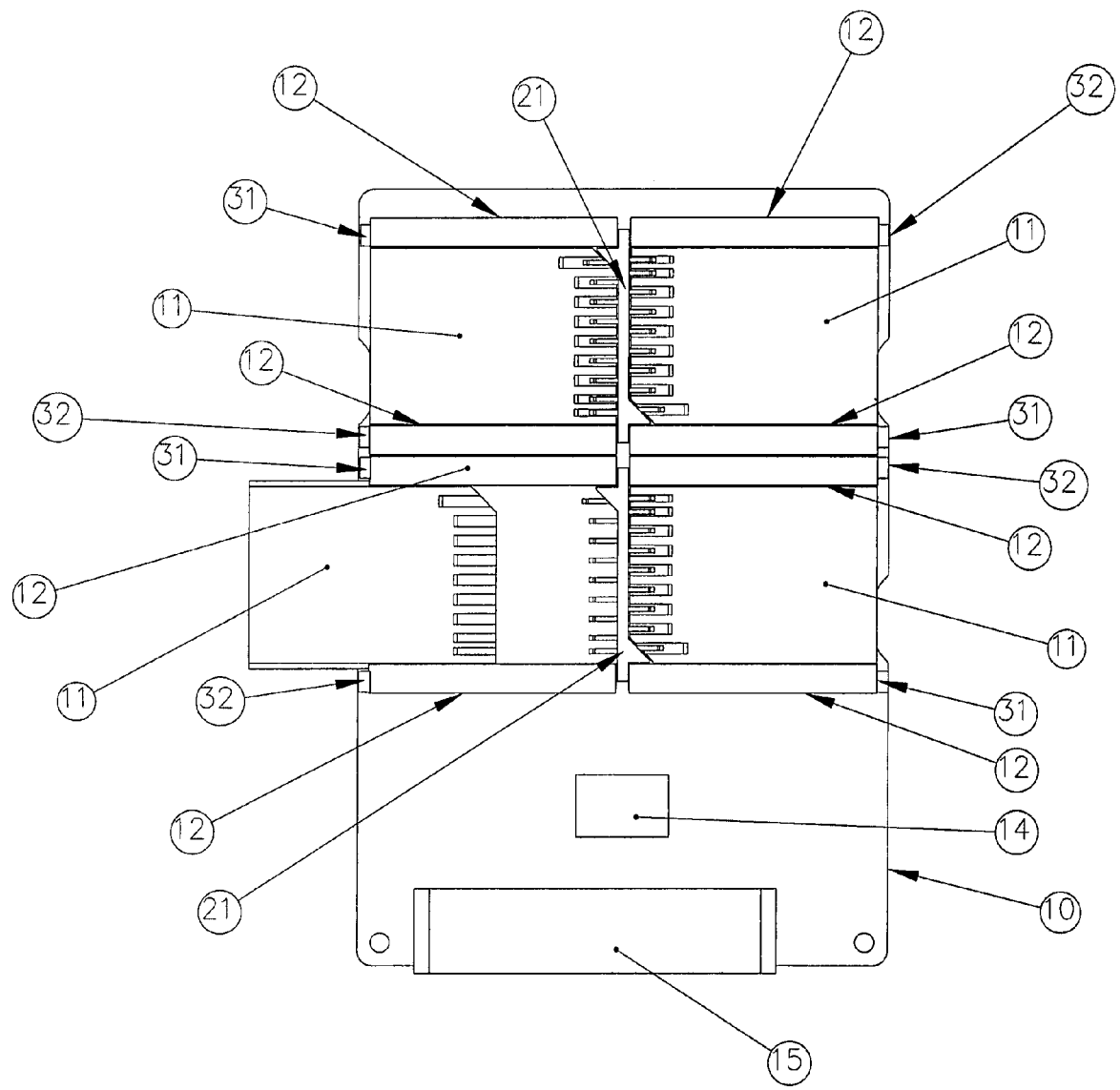
FIG. 1B shows a top view of a device using the modular flash memory card expansion system with a flash memory card being inserted.

FIG. 1A shows a top view of a device using the modular flash memory card expansion system. All the components of the system are electrically connected through a board 10 such as a printed circuit board (PCB) or substrate. Controller 14 communicates with the host (not shown) through interface 15 and all the flash memory cards 11. The host side interface in this case is a serial Advanced Technology Attachment (ATA) or Serial Advanced Technology Attachment (SATA). The storage host interface can be any type of input-output (IO) interface including SATA, Serial Attached SCSI (SAS), Peripheral Component Interconnect (PCI) Express, Parallel Advanced Technology Attachment (PATA), Universal Serial Bus (USB), Bluetooth, Ultra-wideband (UWB) or wireless interface. The flash memory cards 11 are electrically connected through a space-saving module 21. FIG. 1B shows a top view of a device using the modular flash memory card expansion system with a flash memory card 11 being inserted.

Figure 1C:
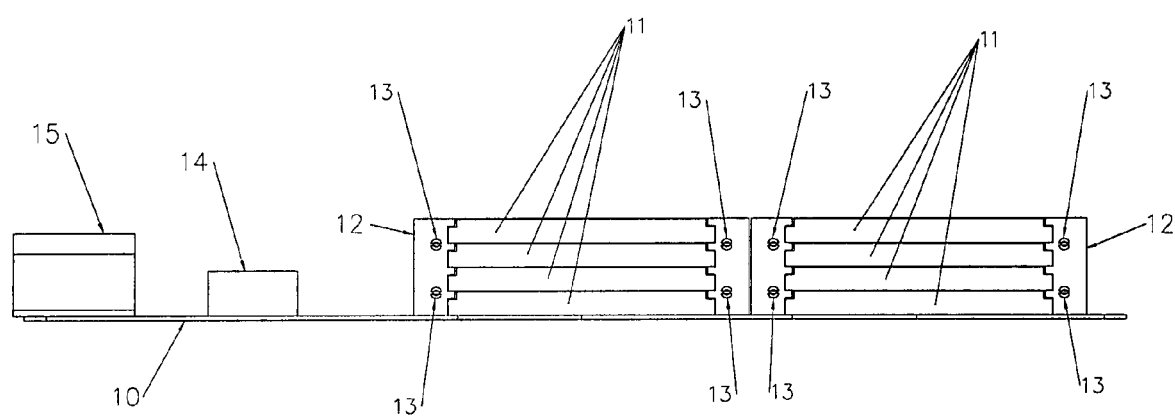
FIG. 1C shows a side view of a device using the modular flash memory card expansion system without latches.
Figure 1D:
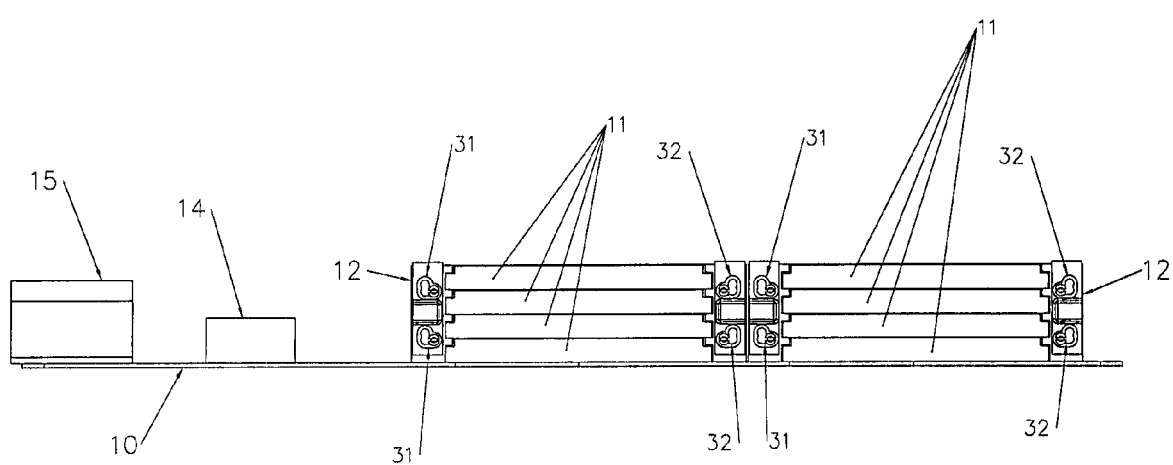
FIG. 1D shows a side view of a device using the modular flash memory card expansion system with latches.

The first attribute of the space saving module 21 is the support 12 for the flash memory cards 11. FIG. 1C shows a side view of a device using the modular flash memory card expansion system without latches. Referring to FIG. 1C, the supports 12 have guided rails that guide the flash memory cards 11 in position. Each support 12 also has knobs 13. FIG. 1D shows a side view of a device using the modular flash memory card expansion system with latches. As shown in FIG. 1D, the knobs 13 support latches 31 and 32. The latches 31, 32 help secure the flash memory cards 11 properly when in a closed position.

Figure 2A:
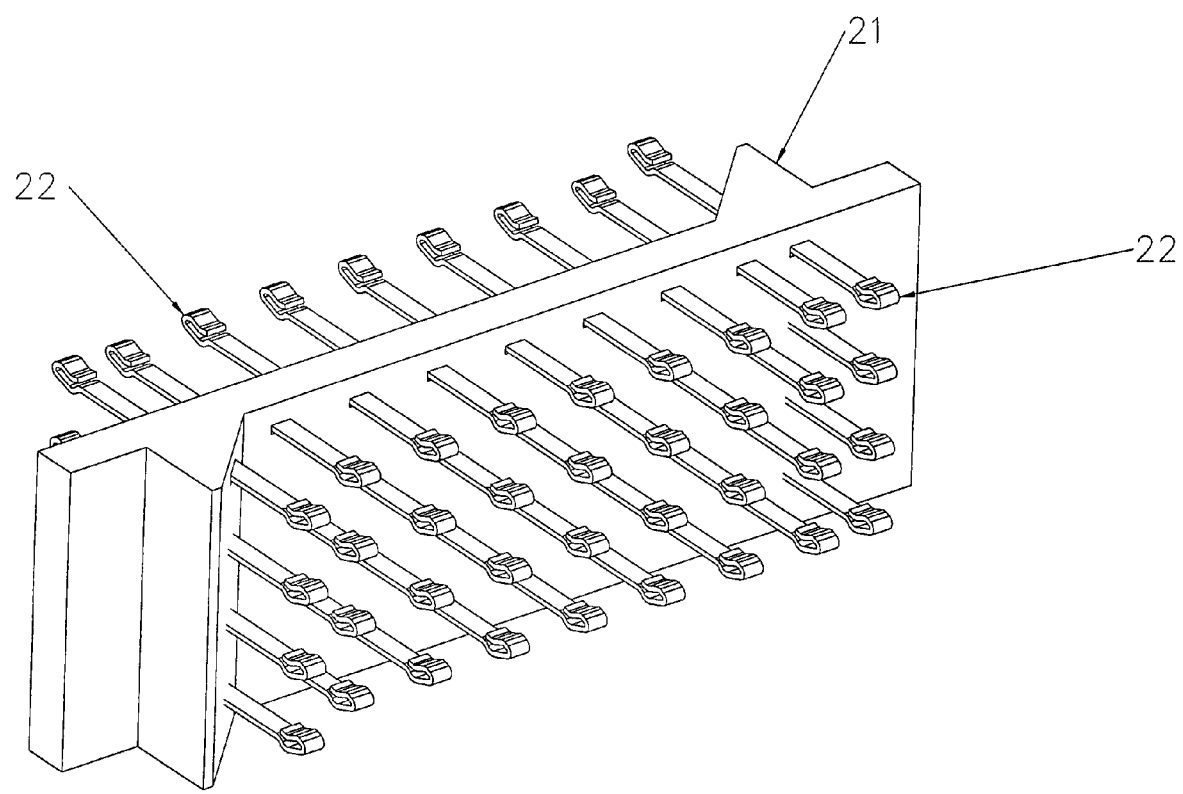
FIG. 2A shows the modular flash memory card expansion system with multiple-layer of pins.
Figure 2B:
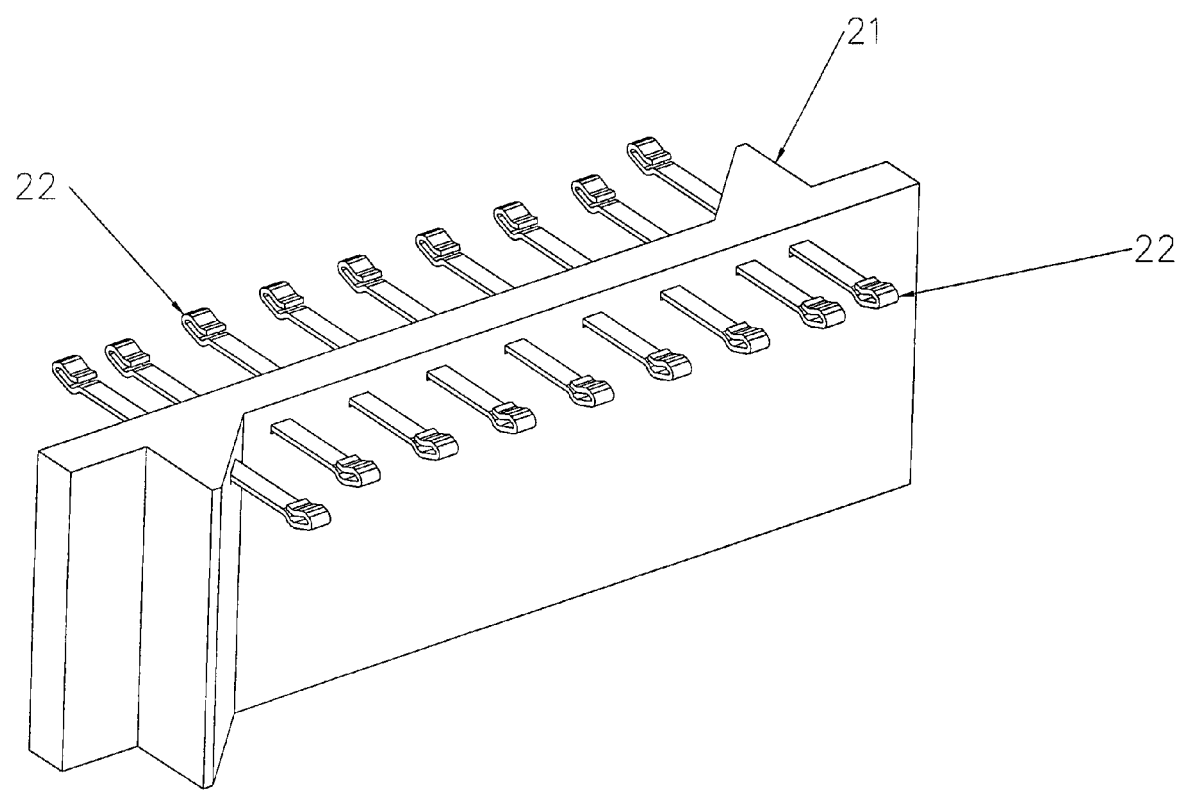
FIG. 2B shows the modular flash memory card expansion system with only one layer of pins.
Figure 2C:
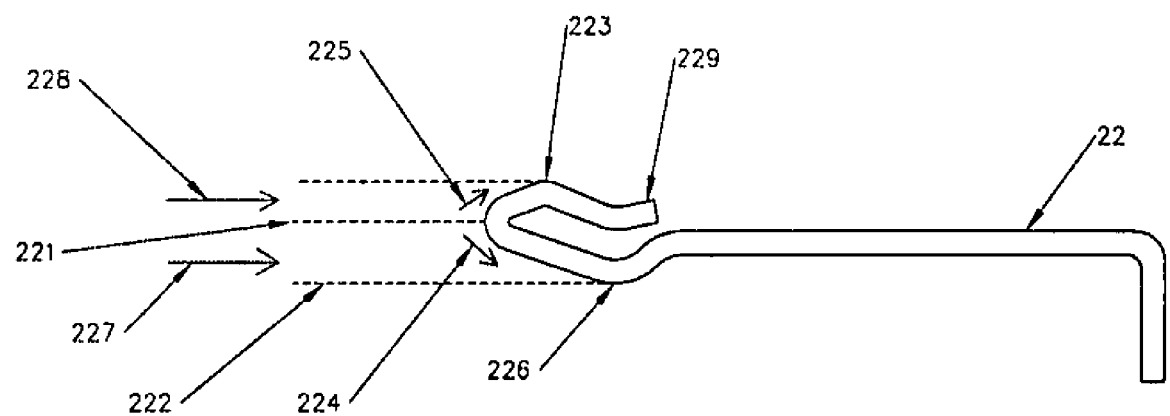
FIG. 2C shows the pin structure.

FIG. 2A shows the modular flash memory card expansion system with multiple-layer of pins. The pins 22, which make contact with the flash memory cards 11, are attached to a space saving module 21. This module 21 electrically connects the pins 22 to the board 10. The module 21 also securely holds the pins rigid by using an over-molding process, or the like. FIG. 2B shows the modular flash memory card expansion system with only one layer of pins. FIG. 2C shows the pin structure 220. When the existing flash memory card 11 (not shown) is inserted below the centerline 221 of the pin structure 220, the resulting direction between the vector force 227 and vector 224 will automatically force the flash memory card 11 (not shown) to move downward and contact with first curved portion 226, and at the same time push up first curved portion 226. When the upper level flash memory card 11 (not shown) is inserted above the centerline 221, the resulting direction between the vector force 228 and vector 225 will automatically force the flash memory card 11 (not shown) to move upward, and at the same time push down the second curved portion 223, thus, preventing the pin 22 from bending or being damaged. With a second curved portion 223 in a push down position, and the first curved portion 226 in a push up position, it also provides the first curved portion 226 with a much greater contact area surface with the flash memory card 11. The end portion 229 is at a certain angle that points outward to allow for more gap spacing.

Figure 3A:
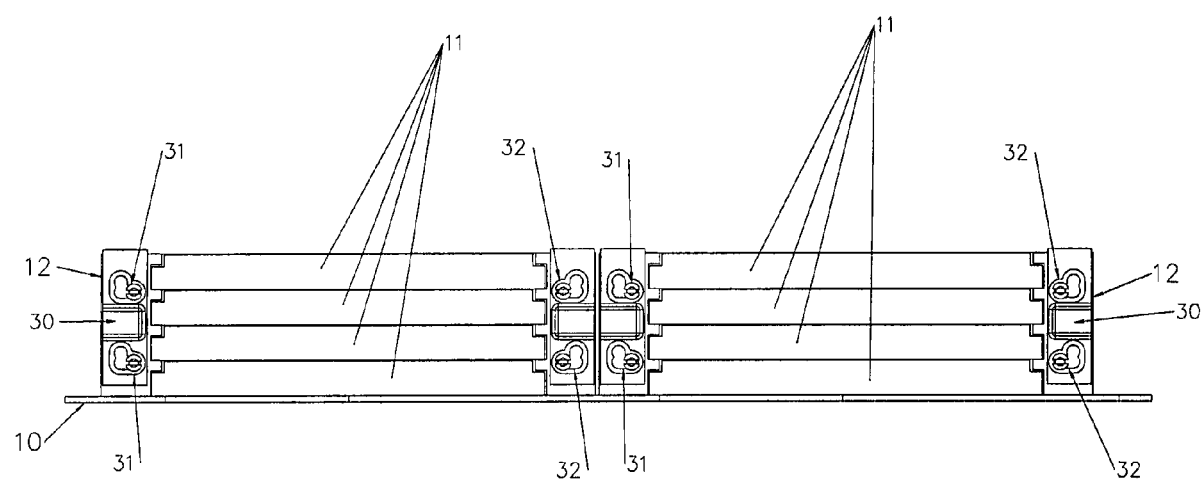
FIG. 3A shows the latch system to secure the flash memory cards in an open position.
Figure 3B:
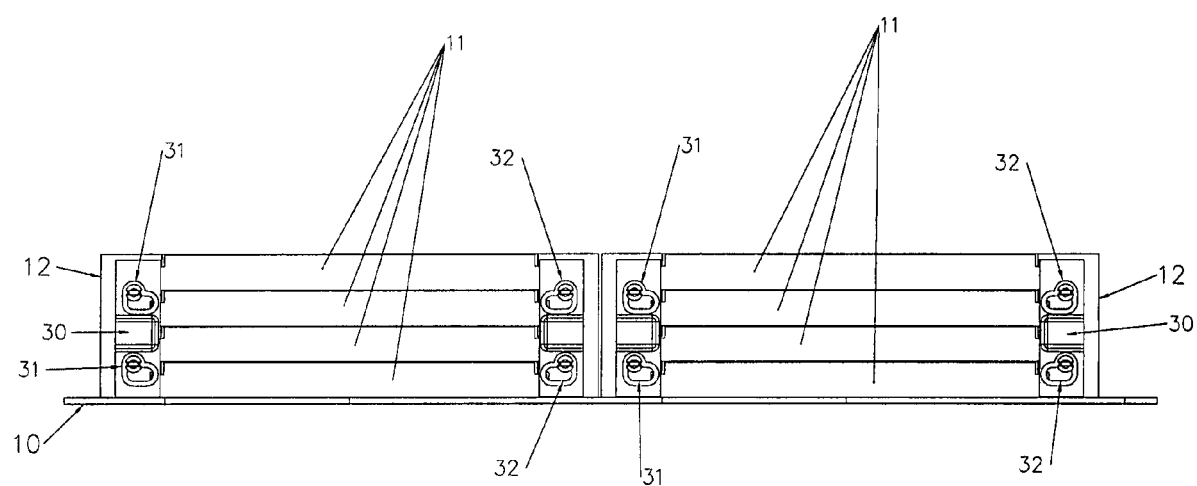
FIG. 3B shows the latch system to secure the flash memory cards in a closed position.
Figure 3C:
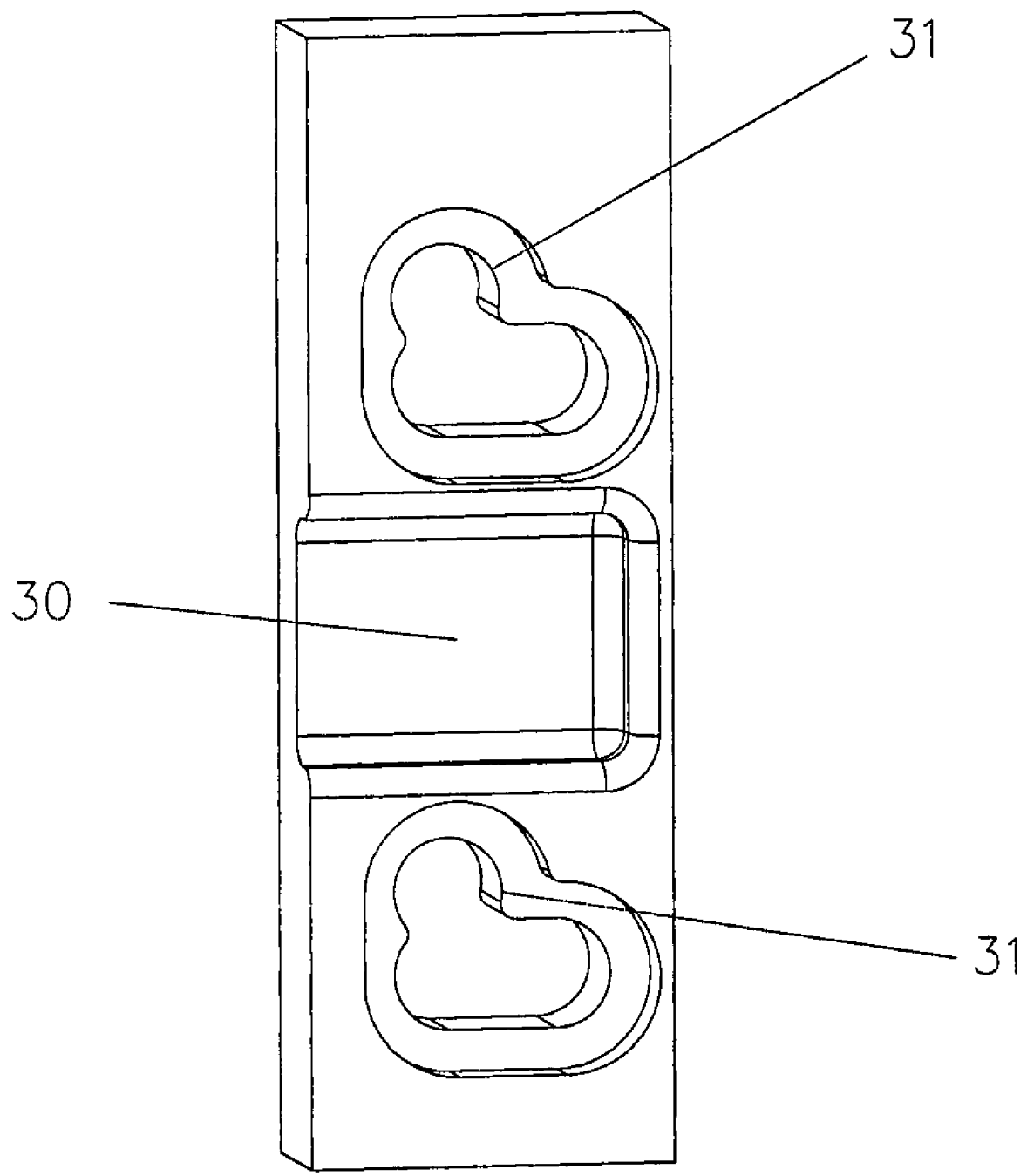
FIG. 3C shows the structure of the left latch.
Figure 3D:
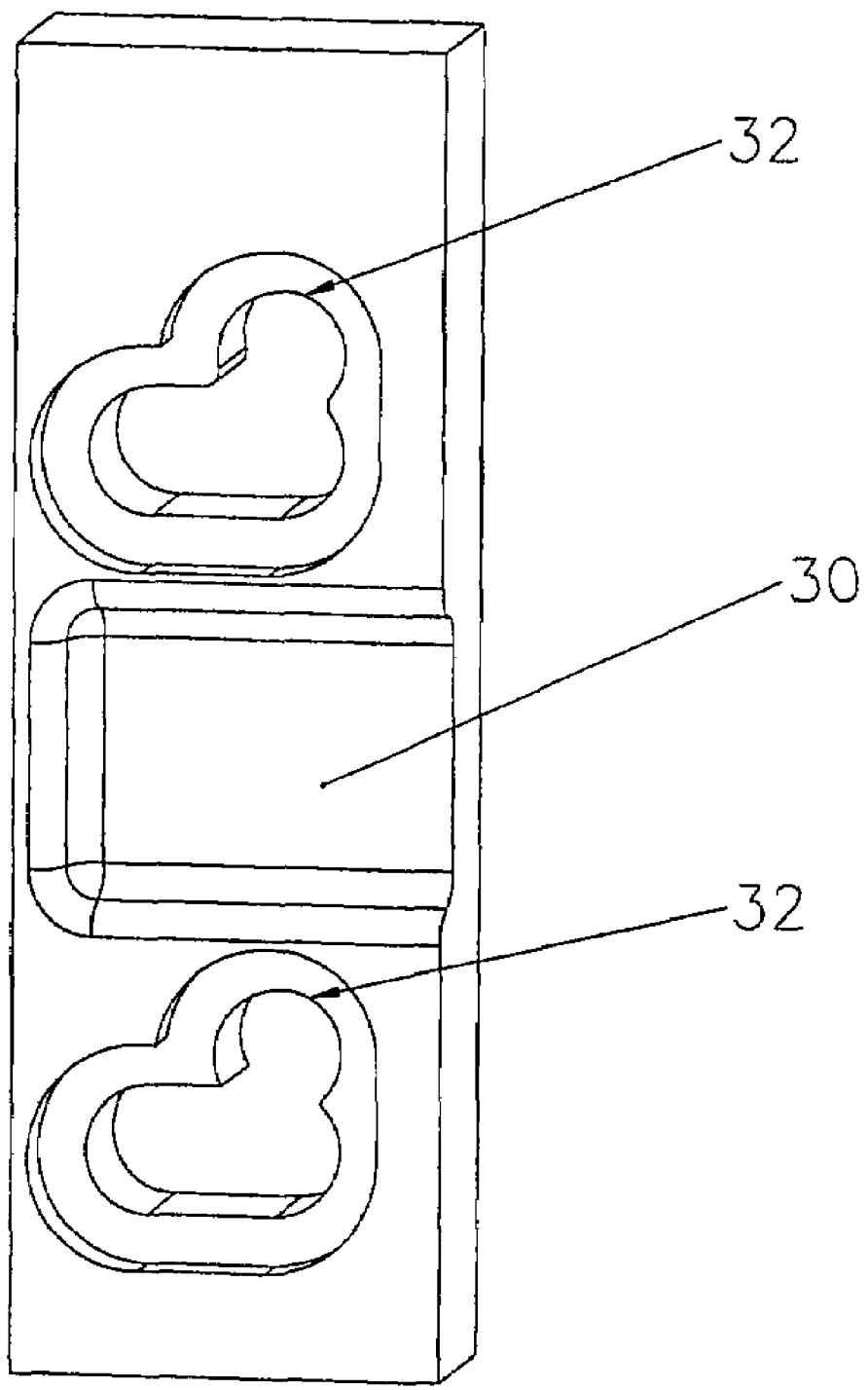
FIG. 3D shows the structure of the right latch.
Figure 1C:
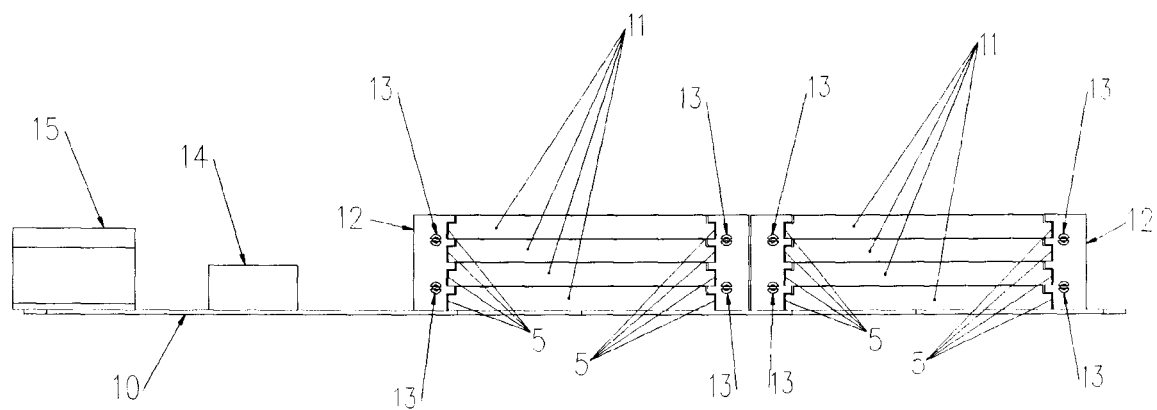

FIG. 3A shows the latch system to secure the flash memory cards in an open position, which allows the flash memory cards 11 to be removed. FIG. 3B shows the latch system to secure the flash memory cards in a closed position, which helps to secure the flash memory cards 11 properly. FIG. 3C shows the structure of the left latch 31. FIG. 3D shows the structure of the right latch 32. An indent 30 is made to allow for better grip when transitioning between close and open position.

The present invention addresses the modular flash memory card expansion system from the following aspects:

1. Memory capacity can be easily expanded with multiple level of flash memory cards.
2. Utilize a space saving module with multiple level of pins.
3. Utilize a pin structure that can prevent bend or damage pin.
4. A simple latching mechanism to secure the flash memory cards.
5. Provide a simple way of memory expansion. Ease of manufacturing.
6. Provide a cost effective solution for memory expansion.
7. Faster time to market.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A memory card system comprising:
   at least one memory card;
   a module for holding the at least one memory card, the module comprising a plurality of supports, the supports including rails to guide the at least one memory card in place, a latch system for securing the at least one memory card to the module; and at least one layer of pins for electrically connecting the module to a printed circuit board; wherein when a memory card is coupled above a centerline of the pin, the resulting direction from the insertion of the memory card will force the card to move upward and wherein the pin is prevented from bending or being damaged.

2. The memory card system of claim 1, wherein the latch system comprises a plurality of latches and a plurality of knobs for controlling the latches.

3. The memory card system of claim 1 wherein when the plurality of latches are in an open position at least one memory card can be removed from the module and when the plurality of latches are in a closed position the at least one memory card is secured to the module.

4. The memory card system of claim 3 wherein each of the pins comprise a first curved portion; a second curved portion coupled to the first curved portion and an end portion coupled to the second curved portion, wherein when a flash memory card is inserted below the centerline of the pin, the resulting direction from the insertion of the memory card will force the card to move downward and be in contact with the first curved portion and cause the first curved portion to move in an upward direction, wherein when the memory card is coupled above the centerline of the pin, the resulting direction from the coupling of the memory card will force the card to move upward and be in contact with the second curved portion and cause the second curved portion to move in a downward direction, wherein the pin is prevented from bending or being damaged; and wherein a greater contact area surface is provided with the memory card.

5. The memory card system of claim 1 wherein the at least one layer of pins comprises a plurality of layers.

6. The memory card system of claim 3 wherein the at least one memory card comprises a flash memory card.

7. A flash memory card system comprising:
   a printed circuit board;
   a plurality of flash memory cards; and
   a module for holding the plurality of flash memory cards, the module comprising a plurality of supports, the supports including rails to guide the at least one of the plurality of flash memory cards in place, and a latch system for securing the at least one memory card to the module; and wherein the latch system comprises a plurality of latches and a plurality of knobs for controlling the latches; and
   a plurality of layers of pins for electrically connecting the module to the printed circuit board, each of the plurality of pins allowing for electrical connection of each of the plurality of flash memory cards to the circuit board, wherein when the plurality of latches are in an open position at least one memory card can be removed from the module and when the plurality of latches are in a closed position the at least one memory card is secured to the module; wherein each of the pins comprise a first curved portion; a second curved portion coupled to the first curved portion and an end portion coupled to the second curved portion, wherein when a flash memory card is inserted below a centerline of the pin, the resulting direction from the insertion of the flash memory card will force the card to move downward and be in contact with the first curved portion and cause the first curved portion to move in an upward direction and wherein when a flash memory card is coupled above the centerline of the pin, the resulting direction from the coupling of the flash memory card will force the card to move upward and be in contact with the second curved portion and cause the second curved portion to move in a downward direction wherein the pin is prevented from bending or being damaged; and wherein a greater contact area surface is provided with the flash memory card as a result of the shape of the pin structure.

8. A memory card system comprising:

at least one memory card;

a module for holding the at least one memory card, the module comprising a plurality of supports, the supports including rails to guide the at least one memory card in place, a latch system for securing the at least one memory card to the module; and at least one layer of pins for electrically connecting the module to a printed circuit board; wherein each of the pins comprise a first curved portion; a second curved portion coupled to the first curved portion and an end portion coupled to the second curved portion, wherein when a memory card is inserted below a centerline of the pin, the resulting direction from the insertion of the memory card will force the card to move downward and be in contact with the first curved portion and cause the first curved portion to move in an upward direction, wherein when a memory card is coupled above a centerline of the pin, the resulting direction from the coupling of the memory card will force the card to move upward and be in contact with the second curved portion and cause the second curved portion to move in a downward direction, wherein the pin is prevented from bending or being damaged; and wherein a greater contact area surface is provided with the memory card.

* * * * *

UNITED STATES PATENT AND TRADEMARK OFFICE
CERTIFICATE OF CORRECTION

| | | |
|---|---|---|
| PATENT NO. | : 7,486,520 B2 | Page 1 of 2 |
| APPLICATION NO. | : 11/754224 | |
| DATED | : February 3, 2009 | |
| INVENTOR(S) | : Choon-Tak Tang et al. | |

It is certified that error appears in the above-identified patent and that said Letters Patent is hereby corrected as shown below:

In the drawings, Sheet 3 of 11, consisting of Fig-1c, should be replaced with the corrected Sheet 3 of 11, consisting of Fig-1c, as shown on the attached page.

Column 2, line 22, the text "FIG. 1, comprises" should be changed to --FIGS. 1A-1D, comprise--.

Column 3, lines 14 to 15 and 16 to 17, the text "pin structure 220", each occurrence, should be changed to --the structure of pin 22--.

Column 4, line 21, claim 4, delete "flash".

Signed and Sealed this
Sixteenth Day of August, 2011

David J. Kappos
*Director of the United States Patent and Trademark Office*